US012647081B2

(12) United States Patent
Kamidaki et al.

(10) Patent No.: US 12,647,081 B2
(45) Date of Patent: Jun. 2, 2026

(54) VARIABLE GAIN AMPLIFIER

(71) Applicant: Fujikura Ltd., Tokyo (JP)

(72) Inventors: Chihiro Kamidaki, Sakura (JP); Yo Yamaguchi, Sakura (JP); Tatsuo Kubo, Sakura (JP)

(73) Assignee: Fujikura Ltd., Tokyo (JP)

( * ) Notice: Subject to any disclaimer, the term of this patent is extended or adjusted under 35 U.S.C. 154(b) by 642 days.

(21) Appl. No.: 18/102,184

(22) Filed: Jan. 27, 2023

(65) Prior Publication Data

US 2023/0396222 A1    Dec. 7, 2023

(30) Foreign Application Priority Data

Jun. 7, 2022    (JP) ................................. 2022-092140

(51) Int. Cl.
*H03F 3/45*        (2006.01)
*H03F 1/56*        (2006.01)
*H03G 1/00*        (2006.01)
*H03G 3/30*        (2006.01)

(52) U.S. Cl.
CPC ........... *H03F 3/45085* (2013.01); *H03F 1/56* (2013.01); *H03G 1/0023* (2013.01); *H03G 3/3015* (2013.01); *H03F 2200/222* (2013.01); *H03F 2200/387* (2013.01)

(58) Field of Classification Search
CPC .. H03F 3/45085; H03F 1/56; H03F 2200/222; H03F 2200/387; H03F 2200/318; H03F 2200/405; H03F 2200/408; H03F 2200/411; H03F 3/45475; H03F 2200/211; H03F 2200/451; H03F 2200/537; H03F 2203/45318; H03F 2203/45604; H03F 2203/45688; H03F 2203/45718; H03F 3/19; H03F 3/265;

H03F 3/45183; H03F 3/245; H03G 1/0023; H03G 3/3015; H03G 1/007; H03G 1/0088; H03G 2201/106; H03G 3/30; H03H 11/245
USPC ......................................................... 330/254
See application file for complete search history.

(56) References Cited

U.S. PATENT DOCUMENTS

| | | | |
|---|---|---|---|
| 5,049,841 | A | 9/1991 | Cooper et al. |
| 6,229,375 | B1 | 5/2001 | Koen |
| 10,027,297 | B2 | 7/2018 | Yuan et al. |
| 2004/0239440 | A1 | 12/2004 | Nyberg |
| 2005/0057305 | A1 | 3/2005 | Krone |
| 2008/0297258 | A1 | 12/2008 | Naito et al. |
| 2018/0102764 | A1 | 4/2018 | Bacon |

(Continued)

FOREIGN PATENT DOCUMENTS

| | | |
|---|---|---|
| CN | 112350686 A | 2/2021 |
| JP | H05-206747 A | 8/1993 |

(Continued)

OTHER PUBLICATIONS

Satoshi Tanaka et al., Progress of the Linear RF Power Amplifier for Mobile Phones, IEICE Trans. Fundamentals, vol. E101-A, No. 2, Feb. 2018, pp. 385-395; (11 pages).

*Primary Examiner* — Andrea Lindgren Baltzell
*Assistant Examiner* — Khiem D Nguyen

(57)            ABSTRACT

A variable gain amplifier includes a differential amplifier circuit having a pair of input terminals and a pair of output terminals, and a first variable attenuation circuit connected between at least one of the pair of input terminals and the pair of output terminals of the differential amplifier circuit and capable of switching a resistance value on the basis of a control signal which is input from the outside.

12 Claims, 13 Drawing Sheets

(56)     References Cited

U.S. PATENT DOCUMENTS

| | | |
|---|---|---|
| 2018/0302063 A1 | 10/2018 | Grelaud et al. |
| 2019/0305758 A1 | 10/2019 | Chen et al. |
| 2021/0013850 A1 | 1/2021 | Cui et al. |

FOREIGN PATENT DOCUMENTS

| | | |
|---|---|---|
| JP | H09-331363 A | 12/1997 |
| JP | 2002-368581 A | 12/2002 |
| JP | 2008-048455 A | 2/2008 |
| JP | 2008-294682 A | 12/2008 |
| JP | 2019-118075 A | 7/2019 |

FIG. 3A
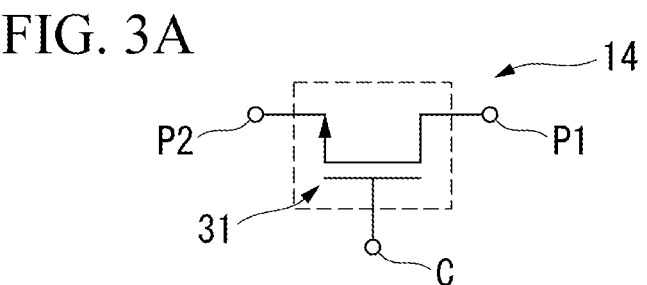
FIG. 3B
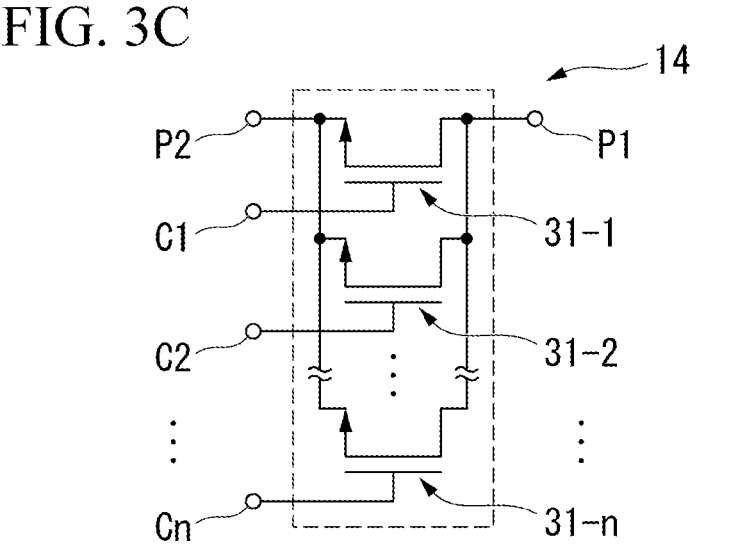
FIG. 3C
FIG. 3D
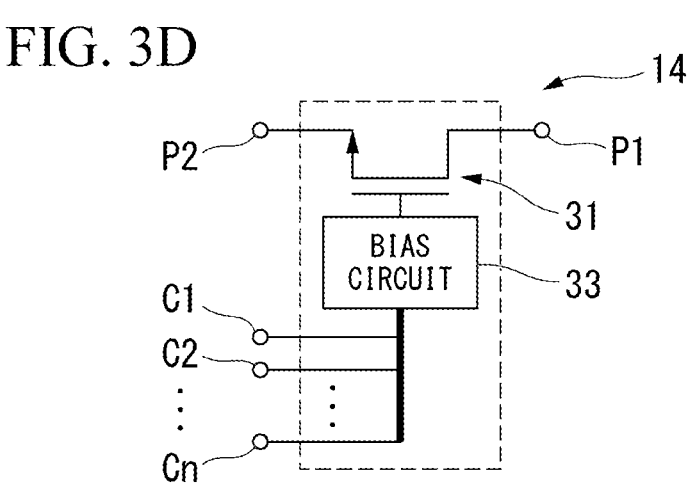

VARIABLE GAIN AMPLIFIER

CROSS-REFERENCE TO RELATED APPLICATION

Priority is claimed on Japanese Patent Application No. 2022-092140, filed Jun. 7, 2022, the content of which is incorporated herein by reference.

BACKGROUND OF THE INVENTION

Field of the Invention

The present invention relates to a variable gain amplifier.

Description of Related Art

In recent years, wireless communication using high-frequency signals of microwaves, millimeter waves, or the like has been in the spotlight. in wireless communication devices that transmit and receive such high-frequency signals, it may be necessary to adjust the level of a transmission signal or a received signal. Variable gain amplifiers are provided in wireless communication devices, for example, in order to perform such power adjustment.

Satoshi Tanaka, "Progress of the linear RF power amplifier for mobile phones," IEICE Trans. Fundamentals, vol. E101-A, No. 2 pp. 385-395, 2018 (hereinafter referred to as Non-Patent Document 1) discloses a two-stage power amplifier in which an amplifier circuit constituted by a transistor and a bias circuit is provided between an input matching circuit and an inter-stage matching circuit, and between the inter-stage matching circuit and an output matching circuit. In addition, Japanese Unexamined Patent Application, First Publication No. 2008-48455 (hereinafter referred to as Patent Document 1) discloses a T-type or π-type attenuator that attenuates a high-frequency signal to an appropriate signal level while impedance matching is maintained. A variable gain amplifier is realized, for example, by combining the power amplifier disclosed in Non-Patent Document 1 and the attenuator disclosed in Patent Document 1.

SUMMARY OF THE INVENTION

In a configuration in which either the power amplifier of Non-Patent Document 1 or the attenuator of Patent Document 1 is switchably connected to a high-frequency signal path, a plurality of paths are required, which makes it difficult to achieve a reduction in size. In addition, in such a configuration, a switching circuit including a field-effect transistor (FET) or the like is required to be connected in series to the high-frequency signal path, resulting in impedance mismatching and an increase in loss.

The present invention has been made in view of the above-described circumstances and an object thereof is to provide a variable gain amplifier that makes it possible to achieve a reduction in size and suppress loss due to impedance mismatching.

A variable gain amplifier according to a first aspect of the present invention includes a differential amplifier circuit having a pair of input terminals and a pair of output terminal, and a first variable attenuation circuit connected between at least one of the pair of input terminals and the pair of output terminals of the differential amplifier circuit and capable of switching a resistance value on the basis of a control signal which is input from the outside.

In the variable gain amplifier according to the first aspect of the present invention, the first variable attenuation circuit is connected between at least one of the pair of input terminals and the pair of output terminals of the differential amplifier circuit that amplifies a high-frequency signal, and the resistance value between the at least one of the pair of input terminals and the pair of output terminals can be switched on the basis of the control signal which is input from the outside. This eliminates the need to switchably connect an attenuator to a high-frequency signal path as in the related art, and thus it is possible to achieve a reduction in size. In addition, since there is no need to connect a switching circuit including a field-effect transistor (FET) or the like in series to the high-frequency signal path, it is possible to suppress loss due to impedance mismatching.

According to a second aspect of the present invention, in the variable gain amplifier according to the first aspect of the present invention, the differential amplifier circuit may include N (N is an integer equal to or greater than 2) differential amplifier circuits cascade-connected to each other in a propagation direction of a high-frequency signal, and the first variable attenuation circuit may be connected between the pair of input terminals of at least one of the differential amplifier circuits in second to nth stages counted from the pair of input terminals of the variable gain amplifier.

According to a third aspect of the present invention, the variable gain amplifier according to the second aspect of the present invention may further include a second variable attenuation circuit connected between the pair of output terminals of the differential amplifier circuit at a preceding stage of the differential amplifier circuit including the pair of input terminals to which the first variable attenuation circuit is connected, and capable of switching a resistance value between the pair of output terminals on the basis of a control signal which is input from the outside.

According to a fourth aspect of the present invention, in the variable gain amplifier according to any one of the first to third aspects of the present invention, the first variable attenuation circuit may include a transistor connected between the pair of input terminals.

According to a fifth aspect of the present invention, in the variable gain amplifier according to the fourth aspect of the present invention, the first variable attenuation circuit may include a resistor connected in series or in parallel to the transistor.

According to a sixth aspect of the present invention, in the variable gain amplifier according to the fourth or fifth aspect of the present invention, the transistor may be controlled to be in an on state or an off state on the basis of the control signal.

According to a seventh aspect of the present invention, in the variable gain amplifier according to the fourth or fifth aspect of the present invention, the first variable attenuation circuit may include a plurality of the transistors, and the plurality of transistors may be individually controlled to be in an on state or an off state on the basis of a plurality of the control signals.

According to an eighth aspect of the present invention, in the variable gain amplifier according to the fourth or fifth aspect of the present invention, the first variable attenuation circuit may further include a bias circuit configured to adjust a resistance value of the transistor by changing a bias voltage applied to the transistor on the basis of a plurality of control signals which are input from the outside.

According to a ninth aspect of the present invention, in the variable gain amplifier according to the third aspect of the present invention, the second variable attenuation circuit may include a transistor connected between the pair of output terminals.

According to a tenth aspect of the present invention, in the variable gain amplifier according to the ninth aspect of the present invention, the second variable attenuation circuit may include a resistor connected in series or in parallel to the transistor.

According to an eleventh aspect of the present invention, in the variable gain amplifier according to the ninth or tenth aspect of the present invention, the transistor may be controlled to be in an on state or an off state on the basis of the control signal.

According to a twelfth aspect of the present invention, in the variable gain amplifier according to the ninth or tenth aspect of the present invention, the second variable attenuation circuit may include a plurality of the transistors, and the plurality of transistors may be individually controlled to be in an on state or an off state on the basis of a plurality of the control signals.

According to a thirteenth aspect of the present invention, in the variable gain amplifier according to the ninth or tenth aspect of the present invention, the second variable attenuation circuit may further include a bias circuit configured to adjust a resistance value of the transistor by changing a bias voltage applied to the transistor on the basis of a plurality of control signals which are input from the outside.

According to a fourteenth aspect of the present invention, in the variable gain amplifier according to the third aspect of the present invention, the first variable attenuation circuit may include a plurality of transistors connected between the pair of input terminals, the second variable attenuation circuit may include a plurality of transistors connected between the pair of output terminals, gate widths of the plurality of transistors of the first variable attenuation circuit may be different from each other, gate widths of the plurality of transistors of the second variable attenuation circuit may be different from each other, and in a case where the plurality of transistors of the first variable attenuation circuit are lined up in ascending order of gate width and the plurality of transistors of the second variable attenuation circuit are lined up in ascending order of gate width, ratios of gate widths of the transistors in the same place may be the same as each other.

According to the present invention, it is possible to achieve a reduction in size and to suppress loss due to impedance mismatching.

BRIEF DESCRIPTION OF THE DRAWINGS

FIGS. 3A to 3D are circuit diagrams illustrating configuration examples of a variable attenuation circuit according to the first embodiment of the present invention.

FIGS. 9A and 9B are block diagrams illustrating modification examples of the variable gain amplifier according to the second embodiment of the present invention.

FIG. 10 is a diagram illustrating a variable gain amplifier according to a first example.

FIG. 14 is a diagram illustrating a variable gain amplifier according to a third example.

DETAILED DESCRIPTION OF THE INVENTION

Hereinafter, variable gain amplifiers according to embodiments of the present invention will be described in detail with reference to the accompanying drawings.

First Embodiment

Figures 1, 2:
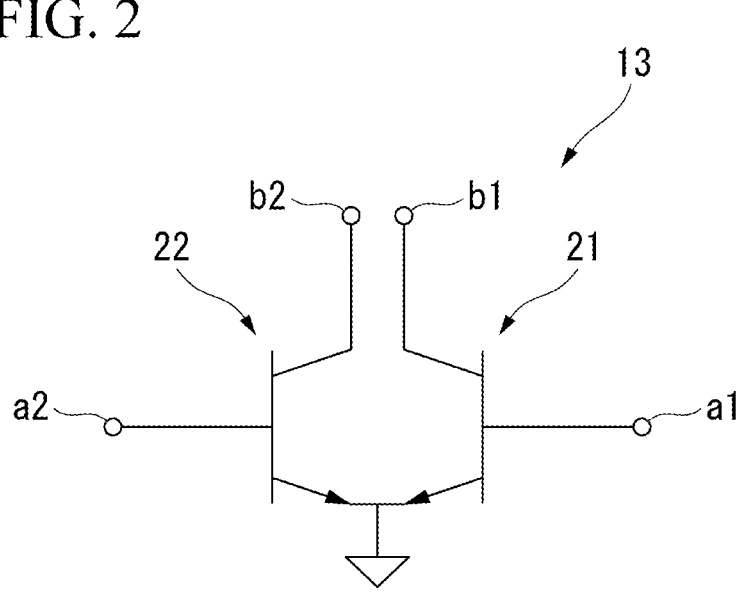
FIG. 1 is a block diagram illustrating main components of a variable gain amplifier according to a first embodiment of the present invention.
FIG. 2 is a circuit diagram illustrating a configuration example of a differential amplifier circuit according to the first embodiment of the present invention.

FIG. 1 is a block diagram illustrating main components of a variable gain amplifier according to a first embodiment of the present invention. As shown in FIG. 1, a variable gain amplifier 1 according to the present embodiment includes an input matching circuit 11, an output matching circuit 12, a differential amplifier circuit 13, and a variable attenuation circuit 14 (first variable attenuation circuit). The variable gain amplifier 1 amplifies a high-frequency signal which is input from a pair of input terminals T11 and T12 and outputs the amplified signal from a pair of output terminals T21 and T22. Although the details will be described later, the amplification factor of the variable gain amplifier 1 can be changed by a control signal which is input from the outside.

Hereinafter, for convenience of description, an upper line (a line to which the input terminal T11, the output terminal T21, and the like are connected) in FIG. 1 and elements connected to the upper line are referred to as a "p side" in some cases. In addition, a lower line (a line to which the input terminal T12, the output terminal T22, and the like are connected) in FIG. 1 and elements connected to the lower line are referred to as an "n side" in some cases. A high-frequency signal which is input to the variable gain amplifier 1 is, for example, a signal of microwaves (3 to 30 [GHz]) or millimeter waves (30 to 300 [GHz]).

The input matching circuit 11 is a circuit that performs impedance matching on the input side of the variable gain amplifier 1 (that is, on a side of the pair of input terminals T11 and T12). The output matching circuit 12 is a circuit that performs impedance matching on the output side of the variable gain amplifier 1 (that is, on a side of the pair of output terminals T21 and T22). Although a case where a signal which is input and output to and from the variable gain amplifier 1 is a balanced signal will be described as an example in the present embodiment, the signal which is input and output to and from the variable gain amplifier 1 may be an unbalanced signal.

In a case where the signal which is input and output to and from the variable gain amplifier 1 is an unbalanced signal, the input matching circuit 11 is provided with a conversion circuit (balun) that converts the unbalanced signal into a balanced signal, and the output matching circuit 12 is provided with a conversion circuit (balun) that converts the balanced signal into an unbalanced signal. In this case, either the p side or the n side is connected to the ground.

The differential amplifier circuit 13 includes a pair of input terminals a1 and a2 and a pair of output terminals b1 and b2. The differential amplifier circuit 13 amplifies high-frequency signals which are input from the pair of input terminals a1 and a2 with a predetermined amplification factor and outputs the amplified signals from the pair of output terminals b1 and b2. The pair of input terminals a1 and a2 of the differential amplifier circuit 13 are connected to the output sides of the input matching circuit 11, and the pair of output terminals b1 and b2 of the differential amplifier circuit 13 are connected to the input sides of the output matching circuit 12. The amplification factor of the differential amplifier circuit 13 can be arbitrarily set according to the application in which the variable gain amplifier 1 is used.

FIG. 2 is a circuit diagram illustrating a configuration example of a differential amplifier circuit according to the first embodiment of the present invention. As shown in FIG. 2, the differential amplifier circuit 13 includes a p-side transistor 21 and an n-side transistor 22. In FIG. 2, for the purpose of simplifying the description, only the transistors 21 and 22 are shown, and circuit elements associated with the transistors 21 and 22 are not shown.

As shown in FIG. 2, the transistors 21 and 22 are bipolar transistors including a base terminal, an emitter terminal, and a collector terminal. The base terminal of the transistor 21 is connected to the input terminal a1 of the differential amplifier circuit 13, the collector terminal thereof is connected to the output terminal b1 of the differential amplifier circuit 13, and the emitter terminal thereof is connected to the ground. The base terminal of the transistor 22 is connected to the input terminal a2 of the differential amplifier circuit 13, the collector terminal thereof is connected to the output terminal b2 of the differential amplifier circuit 13, and the emitter terminal thereof is connected to the ground.

A neutralization capacitor may be provided between the base terminal of the transistor 21 and the collector terminal of the transistor 22, and between the base terminal of the transistor 22 and the collector terminal of the transistor 21. By providing the neutralization capacitor, it is possible to improve isolation between the input side and the output side of the differential amplifier circuit 13. Although FIG. 2 shows an example in which the transistors 21 and 22 are bipolar transistors, the transistors 21 and 22 may be field-effect transistors (FETs).

The variable attenuation circuit 14 is connected between the pair of input terminals a1 and a2 of the differential amplifier circuit 13. The variable attenuation circuit 14 is a circuit which switches a resistance value between the pair of input terminals a1 and a2 of the differential amplifier circuit 13 on the basis of a control signal (not shown) which is input from the outside. The variable attenuation circuit 14 includes two ports P1 and P2. The port P1 is connected to the input terminal a1 of the differential amplifier circuit 13, and the port P2 is connected to the input terminal a2 of the differential amplifier circuit 13.

The variable attenuation circuit 14 is provided to control the amount of attenuation of a high-frequency signal which is input to the differential amplifier circuit 13. For example, in a case where the resistance value of the variable attenuation circuit 14 is relatively large, the amount of attenuation of the high-frequency signal which is input to the differential amplifier circuit 13 can be made relatively small. On the contrary, in a case where the resistance value of the variable attenuation circuit 14 is relatively small, the amount of attenuation of the high-frequency signal which is input to the differential amplifier circuit 13 can be made relatively large.

However, the variable attenuation circuit 14 may be connected between the pair of output terminals b1 and b2 of the differential amplifier circuit 13. That is, the port P1 may be connected to the output terminal b1 of the differential amplifier circuit 13, and the port P2 may be connected to the output terminal b2 of the differential amplifier circuit 13.

FIGS. 3A to 3D are circuit diagrams illustrating configuration examples of the variable attenuation circuit according to the first embodiment of the present invention. The variable attenuation circuit 14 illustrated in FIG. 3A includes a transistor 31. The transistor 31 is an N-type metal oxide film semiconductor field-effect transistor (MOSFET) having a gate terminal, a source terminal, and a drain terminal. The drain terminal of the transistor 31 is connected to the port P1, and the source terminal thereof is connected to the port P2. In addition, the gate terminal of the transistor 31 is connected to a control port C to which a control signal from the outside is input.

The transistor 31 is controlled to be in an on state (electrical conduction state) or an off state (insulated state) on the basis of the control signal which is input to the control port C. In a case where the transistor 31 is in an off state, the port P1 and the port P2 (the pair of input terminals a1 and a2 of the differential amplifier circuit 13) are electrically insulated from each other, and thus a high-frequency signal which is input to the variable attenuation circuit 14 is not attenuated. On the other hand, when the transistor 31 is in an on state, the on-resistance of the transistor 31 establishes resistance connection between the port P1 and the port P2 (between the pair of input terminals a1 and a2 of the differential amplifier circuit 13), thereby attenuating the high-frequency signal which is input to the variable attenuation circuit 14. In this manner, it is possible to control the amount of attenuation of the high-frequency signal which is input to the variable attenuation circuit 14 on the basis of the control signal input to the control port C.

By providing the variable attenuation circuit 14 illustrated in FIG. 3A, there is no need to switchably connect an attenuator to a high-frequency signal path as in the related art, and thus it is possible to achieve a reduction in size. In addition, since there is no need to connect a switching circuit including a field-effect transistor (FET) or the like in series to the high-frequency signal path, it is possible to suppress an increase in loss due to the occurrence of impedance mismatching. Further, in a case where the characteristics of the transistor 31 change due to a change in temperature, the polarity of the temperature gradient of the amplification factor of the differential amplifier circuit 13 and the polarity of the temperature gradient of the on-resistance of the transistor 31 included in the variable attenuation circuit 14 coincide with each other. Therefore, an increase (or, decrease) in the amplification factor of the differential amplifier circuit 13 and an increase (or, decrease) in the signal attenuation factor caused by the variable attenuation circuit 14 occur simultaneously, and thus the temperature change of the amplification factor of the differential amplifier circuit 13 is suppressed. That is, it is possible to improve the temperature characteristics of the variable gain amplifier 1.

The variable attenuation circuit 14 illustrated in FIG. 3B includes a resistor 32 in addition to the transistor 31. The resistor 32 is connected between the drain terminal of the transistor 31 and the port P1. The resistor 32 is provided to adjust the resistance value between the port P1 and the port P2 (between the pair of input terminals a1 and a2 of the differential amplifier circuit 13) when the transistor 31 is in an on state to adjust the amount of attenuation of the high-frequency signal which is input to the variable attenuation circuit 14.

The resistor 32 may be connected between the source terminal of the transistor 31 and the port P2. Alternatively, the resistor 32 may be connected in parallel to the transistor 31. That is, the resistor 32 may be connected between the source terminal and the drain terminal of the transistor 31.

The variable attenuation circuit 14 illustrated in FIG. 3C includes a plurality of transistors 31-1 to 31-$n$ (n is an integer equal to or greater than 2) connected in parallel to each other. The transistors 31-1 to 31-$n$ are the same N-type MOSFETs as the transistor 31 shown in FIGS. 3A and 3B. The drain terminals of the transistors 31-1 to 31-$n$ are connected to the port P1, and the source terminals thereof are connected to the port P2. The gate terminals of the transistors 31-1 to 31$n$ are connected to control ports C1 to Cn, respectively. Control signals for individually controlling the on state or the off state of the transistors 31-1 to 31-$n$ are input to the control ports C1 to Cn.

By individually controlling the on state or the off state of the transistors 31-1 to 31-$n$ with the control signals which are input to the control ports C1 to Cn, the resistance value between the port P1 and the port P2 (between the pair of input terminals a1 and a2 of the differential amplifier circuit 13) can be switched stepwise. That is, the amount of attenuation of the high-frequency signal which is input to the variable attenuation circuit 14 can be adjusted dynamically and stepwise by the control signals which are input to the control ports C1 to Cn.

Here, by making the sizes of the transistors 31-1 to 31-$n$ different from each other, it is possible to efficiently increase the level of the amount of attenuation. Typically, in a case where the sizes of the transistors 31-1 to 31-$n$ increase in this order, it is preferable that the size of the transistor 31-$x$ (x is an integer that satisfies $1 \leq x \leq n$) be $2(x-1)$ times the size of the smallest transistor 31-1. In this way, the amount of attenuation of the variable attenuation circuit 14 can be changed so as to increase or decrease in binary numbers.

In the variable attenuation circuit 14 illustrated in FIG. 3C, each of the transistors 31-1 to 31-$n$ may be connected to the resistor 32 as in the transistor 31 shown in FIG. 3B. That is, n resistors 32 may be connected between the drain terminals of the transistors 31-1 to 31-$n$ and the port P1, respectively. Then resistors 32 may be connected between the source terminals of the transistors 31-1 to 31-$n$ and the port P2, respectively. Alternatively, the n resistors 32 may be connected in parallel to the n transistors 31-1 to 31-$n$, respectively. That is, then resistors 32 may be connected between the source terminals and the drain terminals of the transistors 31-1 to 31-$n$, respectively.

The variable attenuation circuit 14 illustrated in FIG. 3D includes the transistor 31 and a bias circuit 33. The transistor 31 is the same N-type MOSFET as the transistor 31 shown in FIGS. 3A and 3B. The bias circuit 33 includes an input terminal (n-bit input terminal) connected to the control ports C1 to Cn and an output terminal connected to the gate terminal of the transistor 31. The bias circuit 33 switches the resistance value of the transistor 31 stepwise by changing a bias voltage applied to the transistor 31 on the basis of the control signals (n-bit control signals) which are input from the control ports C1 to Cn. Thereby, the amount of attenuation of the high-frequency signal which is input to the variable attenuation circuit 14 can be adjusted dynamically and stepwise.

In the variable attenuation circuit 14 illustrated in FIG. 3D, the transistor 31 may be connected to the resistor 32 as in the transistor 31 shown in FIG. 3B. That is, the resistor 32 may be connected between the drain terminal of the transistor 31 and the port P1. The resistor 32 may be connected between the source terminal of the transistor 31 and the port P2. Alternatively, the resistor 32 may be connected in parallel to the transistor 31. That is, the resistor 32 may be connected between the source terminal and the drain terminal of the transistor 31.

Although FIGS. 3A to 3D show examples in which the transistor 31 and the transistors 31-1 to 31-$n$ are N-type MOSFETs, the transistor 31 and the transistors 31-1 to 31-$n$ may be P-type MOSFETs. Alternatively, the transistor 31 and the transistors 31-1 to 31-$n$ may be bipolar transistors. Further, the transistor 31 and the transistors 31-1 to 31-$n$ may be compound transistors such as high electron mobility transistors (HEMTs).

As described above, in the present embodiment, the differential amplifier circuit 13 is provided between the input matching circuit 11 and the output matching circuit 12, and the variable attenuation circuit 14 is connected between the pair of input terminals a1 and a2 of the differential amplifier circuit 13. The resistance value of the variable attenuation circuit 14 (that is, the resistance value between the pair of input terminals a1 and a2 of the differential amplifier circuit 13) is switched on the basis of a control signal which is input from the outside. Thereby, it is possible to achieve a reduction in size and to suppress loss due to impedance mismatching.

Second Embodiment

Figure 4:
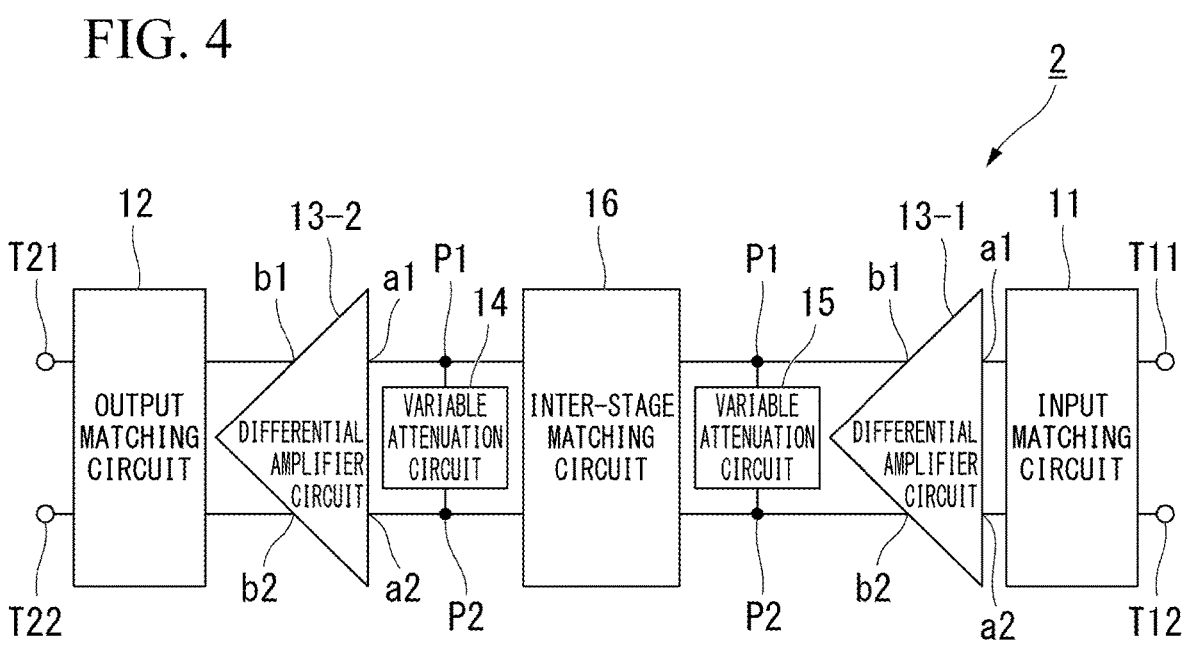
FIG. 4 is a block diagram illustrating main components of a variable gain amplifier according to a second embodiment of the present invention.

FIG. 4 is a block diagram illustrating main components of a variable gain amplifier according to a second embodiment of the present invention. In FIG. 4, components corresponding to the components shown in FIG. 1 are denoted by the same reference numerals and signs. As shown in FIG. 4, a variable gain amplifier 2 according to the present embodiment includes the input matching circuit 11, the output matching circuit 12, differential amplifier circuits 13-1 and 13-2, the variable attenuation circuit 14 (first variable attenuation circuit), a variable attenuation circuit 15 (second variable attenuation circuit), and an inter-stage matching circuit 16.

The variable gain amplifier 1 of the first embodiment has a one-stage configuration in which only one differential amplifier circuit is provided in the propagation direction of the high-frequency signal. On the other hand, the variable gain amplifier 2 of the present embodiment has a two-stage configuration in which two differential amplifier circuits are provided in the propagation direction of the high-frequency signal. Similarly to the variable gain amplifier 1, the variable gain amplifier 2 amplifies the high-frequency signals which are input from the pair of input terminals T11 and T12 and outputs the amplified signals from the pair of output terminals T21 and T22. In addition, the amplification factor of the variable gain amplifier 2 can be changed by a control signal which is input from the outside.

The input matching circuit 11 and the output matching circuit 12 have the same configuration as that shown in FIG. 1. The differential amplifier circuits 13-1 and 13-2 have the same configuration as the differential amplifier circuit 13 shown in FIG. 1. The differential amplifier circuits 13-1 and 13-2 amplify high-frequency signals which are input from the pair of input terminals a1 and a2 with a predetermined amplification factor and output the amplified signals from the pair of output terminals b1 and b2. The differential amplifier circuits 13-1 and 13-2 may have a configuration, for example, as shown in FIG. 2. The amplification factors of the differential amplifier circuits 13-1 and 13-2 can be arbitrarily set according to the application in which the variable gain amplifier 2 is used. The amplification factors of the differential amplifier circuits 13-1 and 13-2 may be the same as or different from each other.

The differential amplifier circuits 13-1 and 13-2 are cascade-connected to each other in the propagation direction of the high-frequency signal with the inter-stage matching circuit 16 interposed therebetween. Specifically, the pair of input terminals a1 and a2 of the differential amplifier circuit 13-1 are connected to the output side of the input matching circuit 11, and the pair of output terminals b1 and b2 thereof are connected to the input side of the inter-stage matching circuit 16. The pair of input terminals a1 and a2 of the differential amplifier circuit 13-2 are connected to the output side of the inter-stage matching circuit 16, and the pair of output terminals b1 and b2 thereof are connected to the input side of the output matching circuit 12.

A positional relationship between the variable attenuation circuit 14 and the differential amplifier circuit 13-2 is the same as that shown in FIG. 1. The variable attenuation circuit 15 is connected between the pair of output terminals b1 and b2 of the differential amplifier circuit 13-1. The variable attenuation circuit 15 is a circuit which switches a resistance value between the pair of output terminals b1 and b2 of the differential amplifier circuit 13-1 on the basis of a control signal (not shown) which is input from the outside. Similar to the variable attenuation circuit 14, the variable attenuation circuit 15 includes two ports P1 and P2. The port P1 is connected to the output terminal b1 of the differential amplifier circuit 13-1, and the port P2 is connected to the output terminal b2 of the differential amplifier circuit 13-1.

The variable attenuation circuit 15 is provided to improve the frequency characteristics of the variable gain amplifier 2 by adjusting the resistance value between the output terminals b1 and b2 of the differential amplifier circuit 13-1. The variable attenuation circuit 15 may have the same configuration as or a different configuration from the variable attenuation circuit 14. The variable attenuation circuit 15 may have a configuration, for example, as shown in any one of FIGS. 3A to 3D.

The inter-stage matching circuit 16 is a circuit that performs impedance matching between a first-stage amplifier circuit including the differential amplifier circuit 13-1 and a second-stage amplifier circuit including the differential amplifier circuit 13-2. Any circuit can be used as the inter-stage matching circuit 16 insofar as it can perform impedance matching between the first-stage amplifier circuit and the second-stage amplifier circuit.

Figure 5:
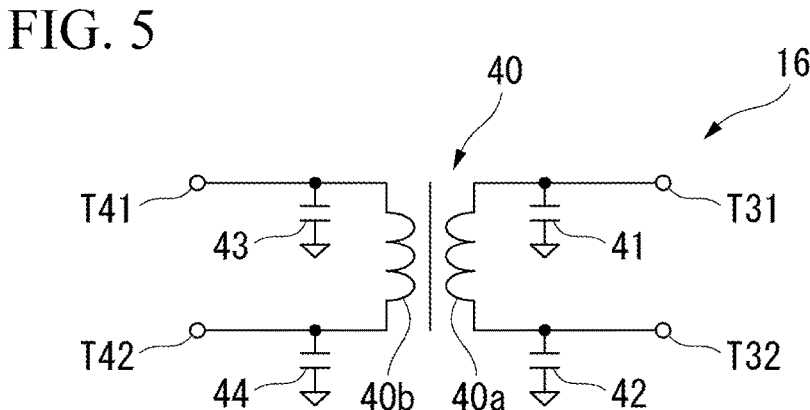
FIG. 5 is a circuit diagram illustrating a configuration example of an inter-stage matching circuit according to the second embodiment of the present invention.

FIG. 5 is a circuit diagram illustrating a configuration example of the inter-stage matching circuit in the second embodiment of the present invention. As shown in FIG. 5, the inter-stage matching circuit 16 includes a transformer 40 and capacitors 41 to 44, and constitutes a transformer coupling type double-tuned circuit. The transformer 40 includes a primary winding 40a and a secondary winding 40b. The primary winding 40a of the transformer 40 is connected between input terminals T31 and T32 of the inter-stage matching circuit 16, and the secondary winding 40b of the transformer 40 is connected between output terminals T41 and T42 of the inter-stage matching circuit 16.

The capacitor 41 is connected between one end of the primary winding 40a, the input terminal T31, and the ground, and the capacitor 42 is connected between the other end of the primary winding 40a, the input terminal T32, and the ground. The capacitor 43 is connected between one end of the secondary winding 40b, the output terminal T41, and the ground, and the capacitor 44 is connected between the other end of the secondary winding 40b, the output terminal T42, and the ground.

Figure 6:
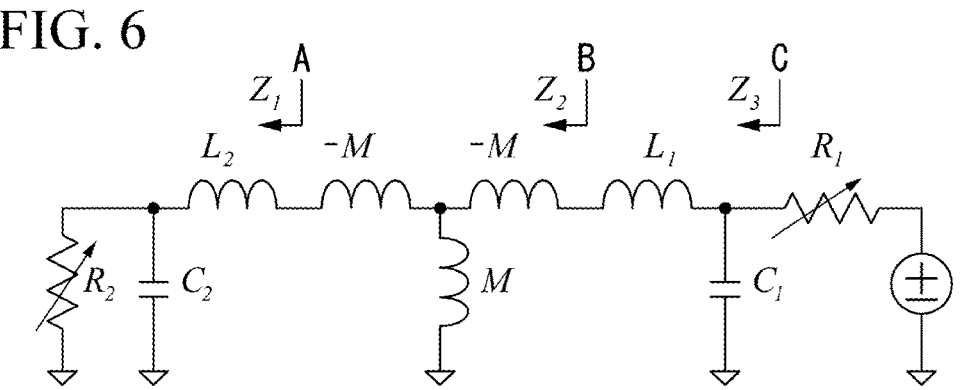
FIG. 6 is an equivalent half circuit of the variable gain amplifier according to the second embodiment of the present invention.

FIG. 6 is an equivalent half circuit of the variable gain amplifier according to the second embodiment of the present invention. Specifically, FIG. 6 is a half circuit including the output impedance of the differential amplifier circuit 13-1, the variable attenuation circuit 15, the inter-stage matching circuit 16, the variable attenuation circuit 14, and the input impedance of the differential amplifier circuit 13-2 which are shown in FIG. 4. Hereinafter, the reason why the frequency characteristics of the variable gain amplifier 2 is improved by providing the variable attenuation circuit 15 will be described with reference to the equivalent half circuit shown in FIG. 6.

In the equivalent half circuit shown in FIG. 6, $L_1$ is a primary-side inductance of the transformer 40 included in the inter-stage matching circuit 16, and $L_2$ is a secondary-side inductance of the transformer 40 included in the inter-stage matching circuit 16. M is an excitation inductance of the transformer 40. $C_1$ is a combined capacitance of the capacitance of the primary-side capacitor (for example, the capacitor 41) included in the inter-stage matching circuit 16 and the parasitic capacitance of the transistor (not shown) included in the differential amplifier circuit 13-1. $C_2$ is a combined capacitance of the capacitance of the secondary-side capacitor (for example, the capacitor 43) included in the inter-stage matching circuit 16 and the parasitic capacitance of the transistor (not shown) included in the differential amplifier circuit 13-2.

$R_1$ is a combined resistance of the output impedance of the transistor (not shown) included in the differential amplifier circuit 13-1 and the equivalent resistance of the variable attenuation circuit 15. $R_2$ is a combined resistance of the input impedance of the transistor (not shown) included in the differential amplifier circuit 13-2 and the equivalent resistance of the variable attenuation circuit 14. Here, the excitation inductance M is expressed by the following Equation (1) using a coupling coefficient k.

[Equation 1]

$$M = k\sqrt{L_1 L_2} \qquad (1)$$

In the variable gain amplifier 2 shown in FIG. 4, switching the variable attenuation circuit 15 between an on state and an off state is equivalent to dynamically changing the combined resistance $R_1$. In addition, switching the variable attenuation circuit 14 between an on state and an off state is equivalent to dynamically changing the combined resistance $R_2$.

Here, as described above, the combined resistance $R_1$ is a combined resistance of the output impedance of the transistor (not shown) included in the differential amplifier circuit 13-1 and the equivalent resistance of the variable attenuation circuit 15. In addition, the combined resistance $R_2$ is a combined resistance of the input impedance of the transistor (not shown) included in the differential amplifier circuit 13-2 and the equivalent resistance of the variable attenuation circuit 14. Therefore, the magnitude of the high-frequency signal that actually acts on each transistor is a value distributed according to the ratio of the impedance of each transistor to the magnitude of each equivalent resistance. Hereinafter, the distribution ratio is assumed to have no frequency characteristics in order not to influence the following discussion, the combined resistance $R_1$ is treated as a source impedance of the equivalent half circuit, and the combined resistance $R_2$ is treated as a load impedance thereof.

Generally, a double-tuned circuit is configured by coupling two resonance circuits. The inter-stage matching circuit 16 shown in FIG. 6 constitutes a transformer coupling type double-tuned circuit. In the inter-stage matching circuit 16, a resonance circuit formed of the capacitance $C_1$ and the inductance $L_1$ and a resonance circuit formed of the capacitance $C_2$ and the inductance $L_2$ are coupled to each other by using the excitation inductance M. Although FIG. 6 shows a transformer coupling type double-tuned circuit, it may be a capacitive coupling type double-tuned circuit. In addition, although the resonance circuit shown in FIG. 6 is a parallel resonance circuit, it may be a series resonance circuit.

Figure 7:
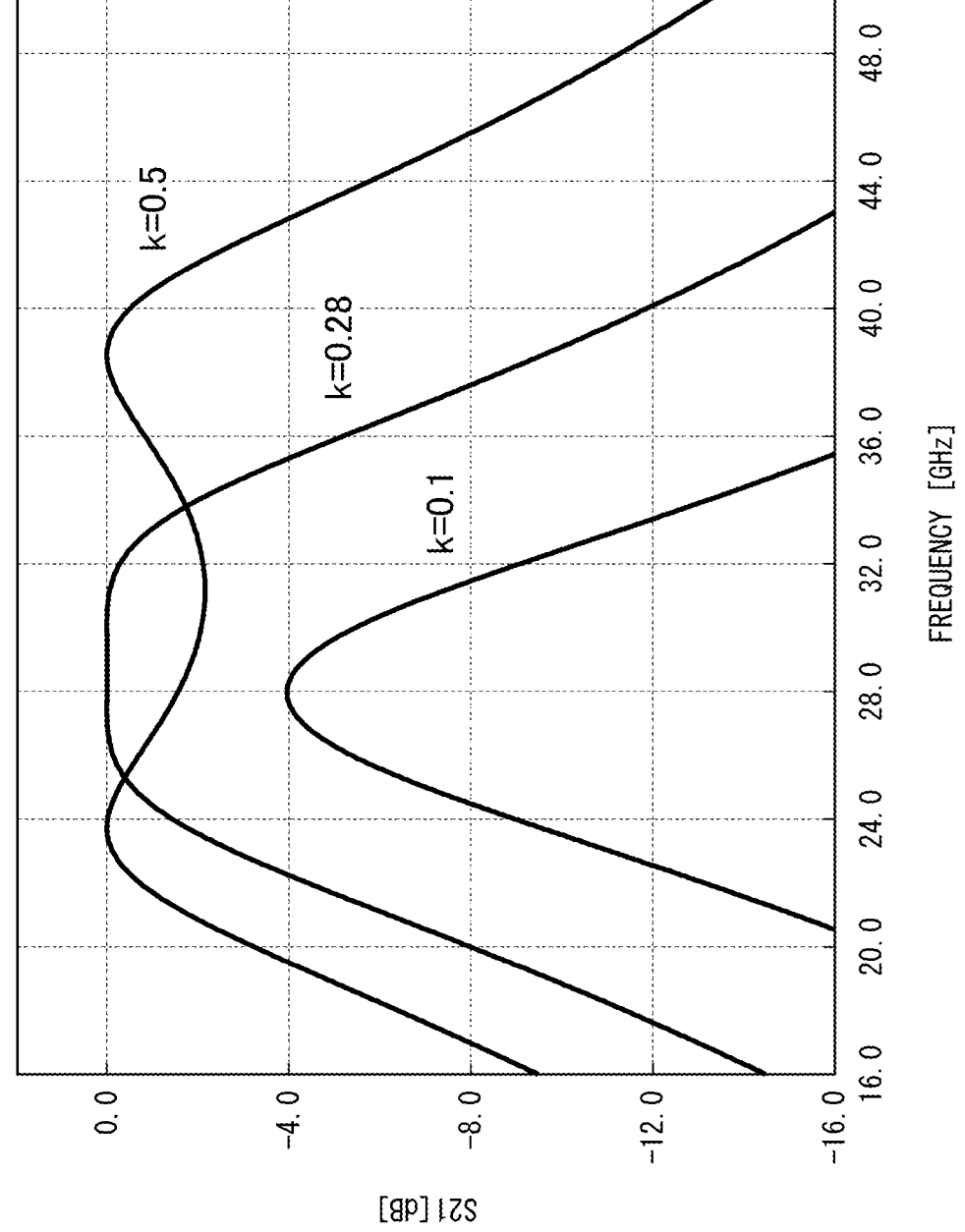
FIG. 7 is a diagram illustrating pass characteristics of the equivalent half circuit shown in FIG. 6.

FIG. 7 is a diagram illustrating pass characteristics of the equivalent half circuit shown in FIG. 6. The pass characteristics shown in FIG. 7 are calculated with the combined resistances $R_1$ and $R_2$ set to 50 [Ω], the capacitance $C_1$ and $C_2$ set to 400 [fF], and the inductance $L_1$, $L_2$ set to 80 [pH] in the equivalent half circuit shown in FIG. 6. In addition, FIG. 7 shows pass characteristics when the coupling coefficient k is set to pass characteristics when the coupling coefficient k is set to 0.28, and pass characteristics when the coupling coefficient k is set to 0.5.

In a case where the coupling coefficient k is 0.28, the double-tuned circuit is in a critical coupling state, and the pass characteristics show band-pass characteristics. The center frequency $f_0$ of the band-pass characteristics is the resonance frequency of each resonance circuit and is expressed by the following Equation (2).

[Equation 2]

$$f_0 = \frac{1}{2\pi\sqrt{L_1 C_1}} = \frac{1}{2\pi\sqrt{L_2 C_2}} \tag{2}$$

In addition, in this case, it is known that the value $Q_L$ of the load Q and the coupling coefficient k in each resonance circuit satisfy the relation of $kQ_L=1$. In the equivalent half circuit shown in FIG. 6, the load Q of each resonance circuit is expressed by the following Equation (3). Here, x in the following Equation (3) is a variable that may be 1 or 2. That is, $L_x$ in the following Equation (3) is $L_1$ or $L_2$, and $R_x$ is $R_1$ or $R_2$. In order to use the band-pass characteristics, the center frequency $f_0$ is generally designed to match the driving frequency of the variable gain amplifier 2.

[Equation 3]

$$Q = \frac{R_x}{2\pi f_0 L_x} \tag{3}$$

In the equivalent half circuit shown in FIG. 6, $Z_1$, $Z_2$, and $Z_3$ are impedances when the equivalent half circuit is viewed from points A, B, and C in the drawing, respectively, in the propagation direction of the high-frequency signal. The impedance $Z_3$ is impedance when the differential amplifier circuit 13-2 is viewed from the combined resistance $R_1$. The impedances $Z_1$, $Z_2$, and $Z_3$ are expressed by the following Equations (4) to (6), respectively.

[Equation 4]

$$Z_1 = \frac{-jR_2 X_{C2} + jR_2 X_{L2} + X_{C2} X_{L2}}{R_2 - jX_{C2}} \tag{4}$$

[Equation 5]

$$Z_2 = \frac{X_M^2}{Z_1} \tag{5}$$

[Equation 6]

$$Z_3 = \frac{-j(Z_2 + jX_{L1})X_{C1}}{Z_2 + jX_{L1} - jX_{C1}} \tag{6}$$

Here, the following relations are established.

[Equation 7]

$$X_{L2} = \omega L_2, \ X_{C2} = \frac{1}{\omega C_2}, \ X_{L1} = \omega L_1, \ X_{C1} = \frac{1}{\omega C_1}, \ X_M = \omega M$$

Referring to Equations (4) to (6), when the combined resistance $R_2$ is multiplied by $\alpha$ ($\alpha$ is a constant), and $X_{C2}$ and $X_{L2}$ are multiplied by a simultaneously (that is, $L_2$ is multiplied by $\alpha$ and $C_2$ is multiplied by $1/\alpha$), the impedance $Z_2$ does not change. In this case, since the impedance $Z_3$ does not also change and there is no change in the matching state, the pass characteristics do not also change. That is, in order to maintain the band-pass characteristics, the value $Q_L$ of the load Q in each resonance circuit needs to be invariable.

Generally, since the output impedance of the transistor is larger than the input impedance of the transistor, the inductance $L_1$ is designed to be larger than the inductance $L_2$ in order to match the value $Q_L$ of the load Q in the primary-side and secondary-side resonance circuits. Therefore, it is preferable that the equivalent resistance of the variable attenuation circuit 15 be larger than the equivalent resistance of the variable attenuation circuit 14. In addition, in a case where the equivalent resistances of the variable attenuation circuits 15 and 14 have a plurality of levels, it is preferable that the plurality of levels change at the same ratio. In addition, it is preferable that the ratio of the equivalent resistance of the variable attenuation circuit 15 to the equivalent resistance of the variable attenuation circuit 14 at each of these levels be equal to the ratio of the primary-side inductance to the secondary-side inductance.

On the other hand, in a case where the variable attenuation circuits 15 and 14 are switched between an on state and off state, the combined resistances $R_1$ and $R_2$ change dynamically, and thus the value $Q_L$ of the load Q in each resonance circuit also changes dynamically. Consequently, numerical calculations were performed to confirm how the pass characteristics change depending on the mode of change in the value $Q_L$ of the load Q in each resonance circuit.

Figure 8A:
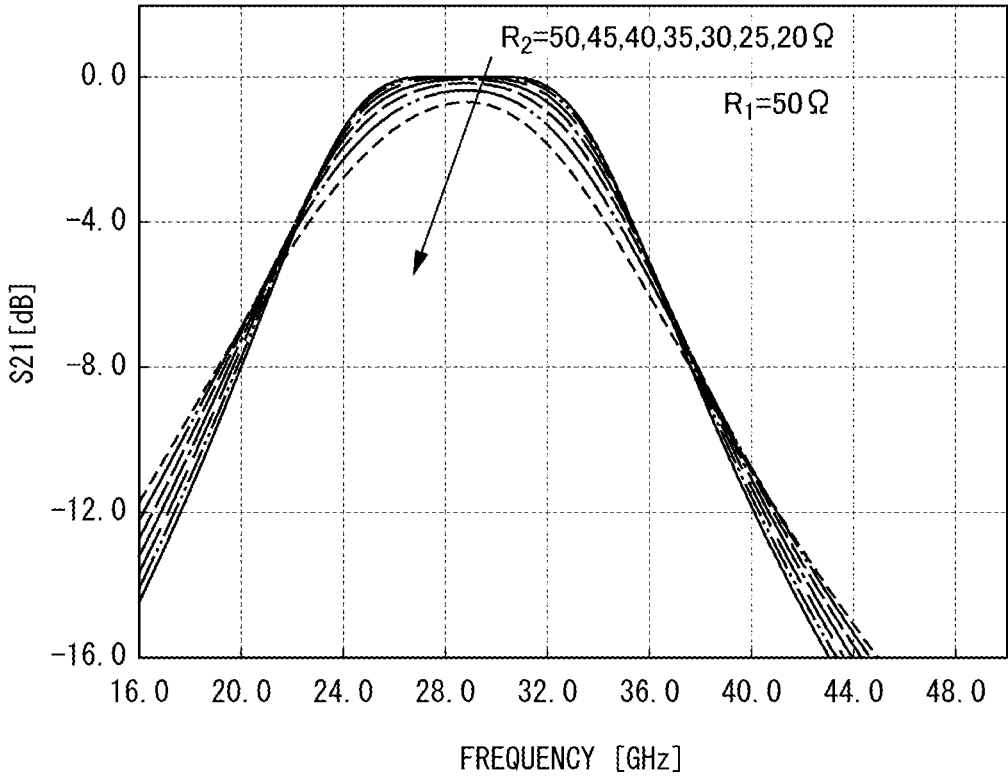
FIGS. 8A and 8B are diagrams illustrating pass characteristics of the equivalent half circuit shown in FIG. 6 in a case where a combined resistance Rz is changed.
Figure 8B:
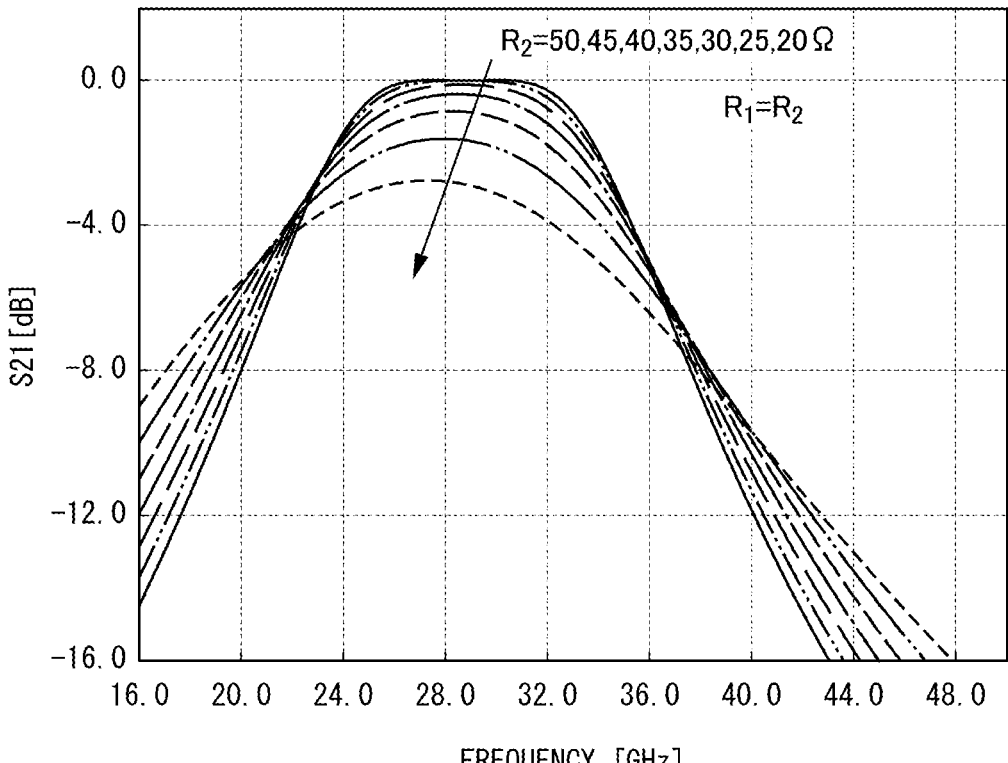

FIGS. 8A and 8B are diagrams illustrating pass characteristics in a case where the combined resistance $R_2$ is changed in the equivalent half circuit shown in FIG. 6. Similarly to a case where the pass characteristics shown in FIG. 7 are calculated, the pass characteristics shown in FIGS. 8A and 8B are calculated with the combined resistances $R_1$ and $R_2$ set to 50 [Ω], the capacitances $C_1$ and $C_2$ set to 400 [fF], the inductances $L_1$ and $L_2$ set to 80 [pH], and the coupling coefficient k set to 0.28.

FIG. 8A illustrates pass characteristics of the equivalent half circuit in a case where the value of the combined resistance $R_1$ is fixed at 50 [Ω] and the combined resistance $R_2$ is changed from 50 [Ω] to 20 [Ω]. FIG. 8B illustrates pass characteristics of the equivalent half circuit in a case where the value of the combined resistance $R_1$ is made to follow the combined resistance $R_2$ while the combined resistance $R_2$ is changed from 50 [Ω] to 20 [Ω]. Referring to FIGS. 8A and 8B, it can be understood that, in a case where the value of the combined resistance $R_1$ is made to follow the combined resistance $R_2$, the characteristics are broader than in a case where the value of the combined resistance $R_1$ is fixed at 50 [Ω], and the amount of attenuation when the value of the combined resistance $R_2$ is equal (for example, the case of $R_2=20$ [Ω] in FIG. 8A and the case of $R_2=20$ [Ω] in FIG. 8B) becomes larger.

In this way, in a case where the variable attenuation circuit 15 and the variable attenuation circuit 14 are operated simultaneously, the frequency characteristics are better and the amount of attenuation is larger than in a case where only the variable attenuation circuit 14 is operated, and thus it can be said that the attenuation circuit exhibits good characteristics. That is, in the case of a two-stage configuration in which two differential amplifier circuits 13-1 and 13-2 are provided in the propagation direction of the high-frequency signal as in the variable gain amplifier 2 of the present embodiment, it is preferable to include the variable attenuation circuit 15 in addition to the variable attenuation circuit 14.

As described above, in the present embodiment, the differential amplifier circuit 13-1 is provided between the input matching circuit 11 and the inter-stage matching circuit 16, and the differential amplifier circuit 13-2 is provided between the inter-stage matching circuit 16 and the output matching circuit 12. In addition, the variable attenuation circuit 14 is connected between the pair of input terminals a1 and a2 of the differential amplifier circuit 13-2, and the variable attenuation circuit 15 is connected between the pair of output terminals b1 and b2 of the differential amplifier circuit 13-1. The resistance values of the variable attenuation circuits 14 and 15 are switched on the basis of control signals which are input from the outside. Thereby, it is possible to achieve a reduction in size and to suppress loss due to impedance mismatching. Additionally, since the frequency characteristics are good and the amount of attenuation can be made larger, it is possible to realize good characteristics as an attenuation circuit.

Figure 9A:
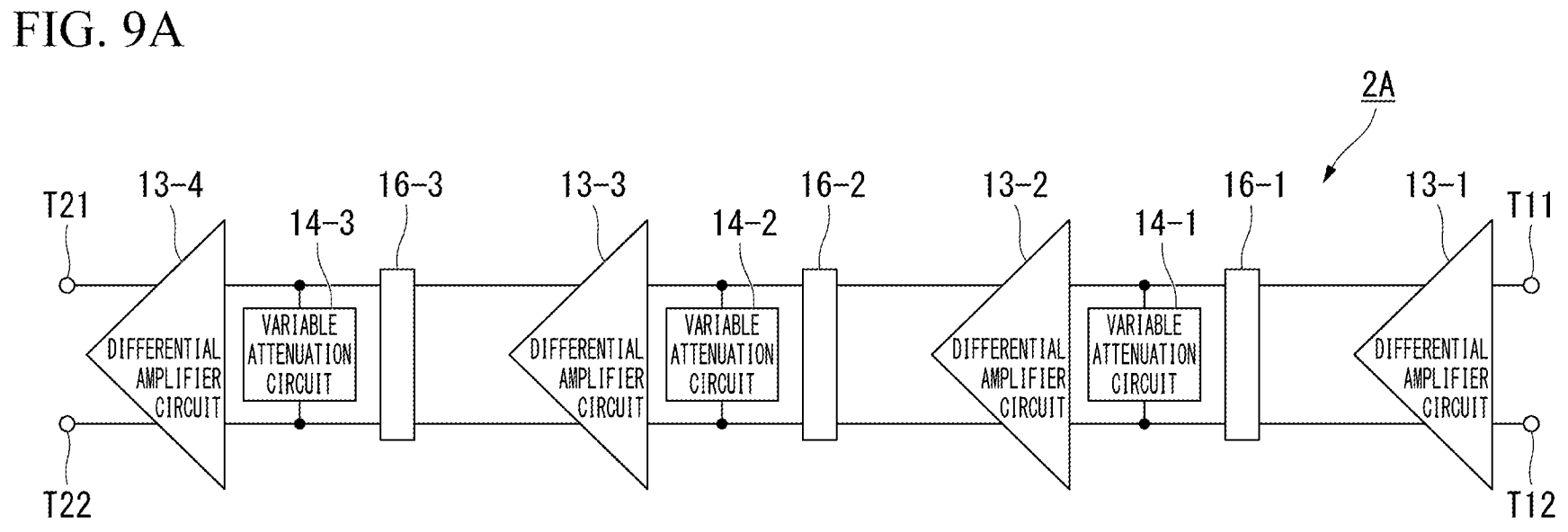
Figure 9B:
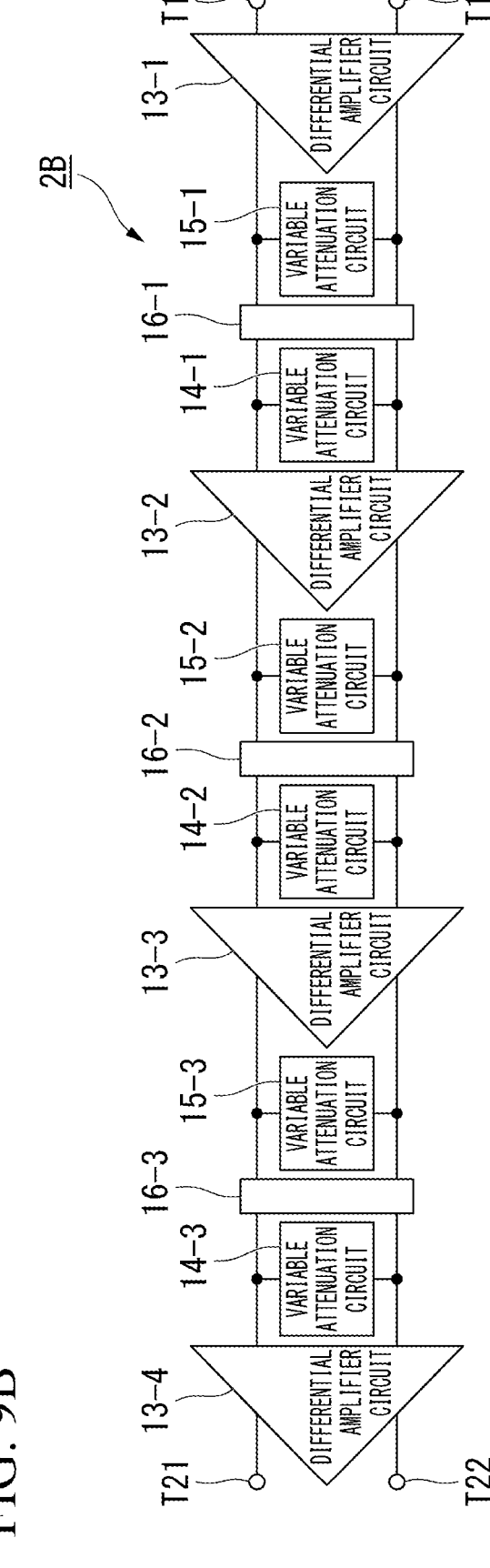

FIGS. 9A and 9B are block diagrams illustrating modification examples of the variable gain amplifier according to the second embodiment of the present invention. In FIGS. 9A and 9B, the input matching circuit 11 and the output matching circuit 12 are not shown. A variable gain amplifier 2A shown in FIG. 9A includes four differential amplifier circuits 13-1 to 13-4 which are cascade-connected to each other and three variable attenuation circuits 14-1 to 14-3 (first variable attenuation circuits) connected between the input terminals of the differential amplifier circuits 13-2 to 13-4, respectively. A variable gain amplifier 2B shown in FIG. 9B is formed by adding three variable attenuation circuits 15-1 to 15-3 (second variable attenuation circuits) connected between the output terminals of the differential amplifier circuits 13-1 to 13-3, respectively, to the variable gain amplifier 2A shown in FIG. 9A.

That is, the variable gain amplifiers 2A and 2B shown in FIGS. 9A and 9B have a four-stage configuration in which the four differential amplifier circuits 13-1 to 13-4 are provided, and are configured with the variable attenuation circuits 14-1 to 14-3 connected between the input terminals of the differential amplifier circuits 13-2 to 13-4 in the second to fourth stages, respectively. In the variable gain amplifier 2A shown in FIG. 9A, a variable attenuation circuit connected between the output terminals of the differential amplifier circuit is omitted, but in the variable gain amplifier 2B shown in FIG. 9B, the variable attenuation circuits 15-1 to 15-3 are connected between the output terminals of the differential amplifier circuits 13-1 to 13-3 in the first to third stages, respectively.

In the variable gain amplifier 2A shown in FIG. 9A, inter-stage matching circuits 16-1 to 16-3 are provided at the preceding stage of the variable attenuation circuit 14-1 to 14-3, respectively. In the variable gain amplifier 2B shown in FIG. 9B, the inter-stage matching circuits 16-1 to 16-3 are provided between the variable attenuation circuits 14-1 and 15-1, between the variable attenuation circuits 14-2 and 15-2, and between the variable attenuation circuits 14-3 and 15-3, respectively.

In a case where the variable gain amplifier includes N (N is an integer equal to or greater than 2) differential amplifier circuits which are cascade-connected to each other, a configuration in which variable attenuation circuits are connected between the input terminals of the differential amplifier circuits in the second to nth stage along the propagation direction of the high-frequency signal may be adopted (see FIG. 9A). Additionally, a configuration in which variable attenuation circuits are connected between the output terminals of the differential amplifier circuits in the first to (N−1)th stages may be adopted (see FIG. 9B).

EXAMPLES

First Example

Figure 10:
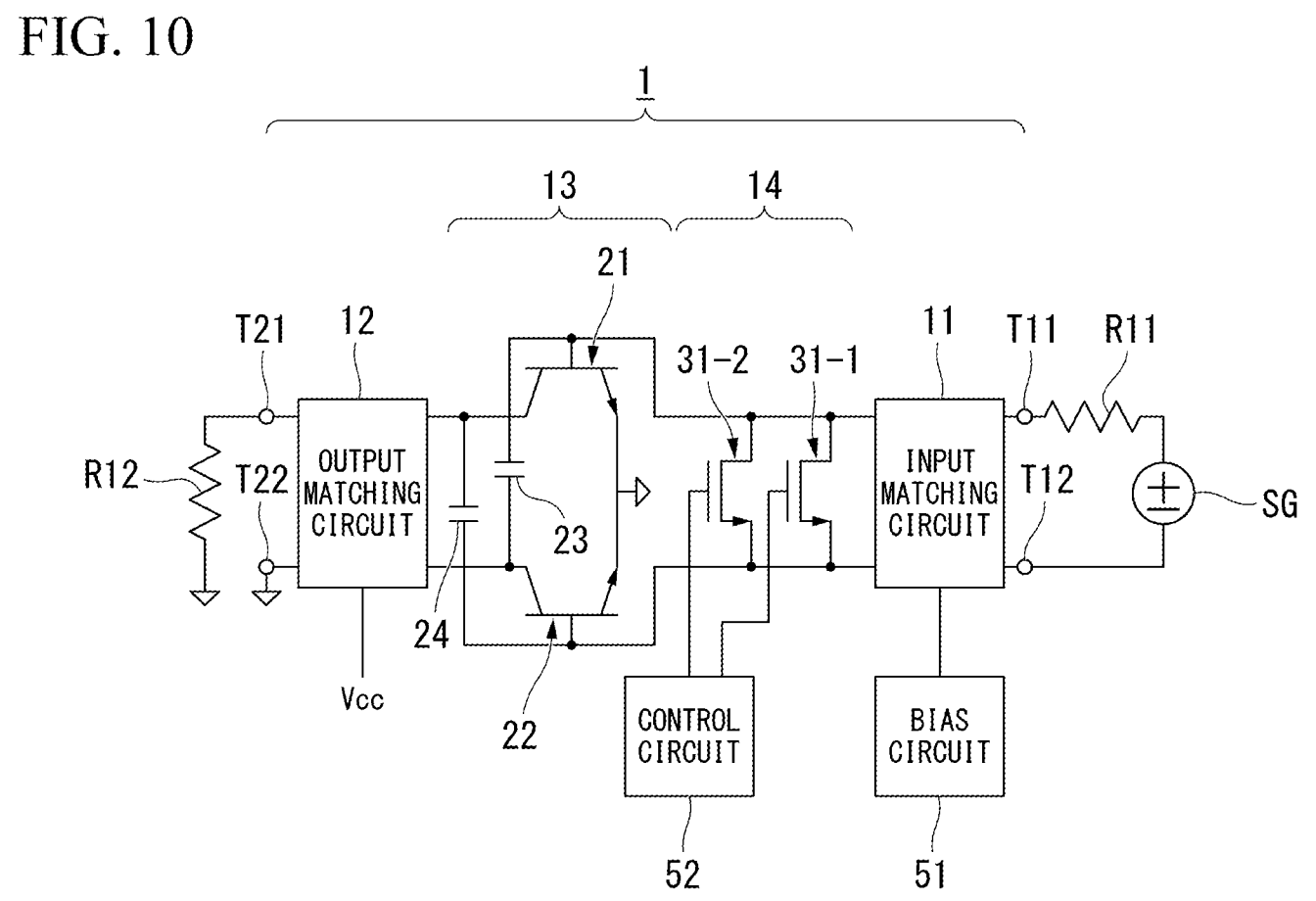

FIG. 10 is a diagram illustrating a variable gain amplifier according to a first example. The present example is an example of the variable gain amplifier 1 according to the first embodiment. In FIG. 10, components corresponding to the components shown in FIGS. 1 to 3D are denoted by the same reference numerals and signs. As shown in FIG. 10, the variable gain amplifier 1 includes a bias circuit 51 and a control circuit 52 in addition to the input matching circuit 11, the output matching circuit 12, the differential amplifier circuit 13, and the variable attenuation circuit 14.

The differential amplifier circuit 13 includes the two transistors 21 and 22 shown in FIG. 2 and two neutralization capacitors 23 and 24. The neutralization capacitor 23 is connected between the base terminal of the transistor 21 and the collector terminal of the transistor 22, and the neutralization capacitor 24 is connected between the base terminal of the transistor 22 and the collector terminal of the transistor 21.

The variable attenuation circuit 14 includes the two transistors 31-1 and 31-2 connected in parallel to each other as shown in FIG. 3C. The transistors 31-1 and 31-2 are N-type MOSFETs. Here, the sizes of the transistor 31-1 (second FET) and the transistor 31-2 (first FET) are as shown in the following Table 1.

TABLE 1

|  | Gate length | Gate width |
| --- | --- | --- |
| First FET | 240 nm | 45 μm |
| Second FET | 240 nm | 90 μm |

A power supply voltage Vcc is supplied to the output matching circuit 12. The power supply voltage Vcc is applied to the collector terminals of the transistors 21 and 22 provided in the differential amplifier circuit 13 via the output matching circuit 12. The bias circuit 51 is connected to the input matching circuit 11. The bias circuit 51 outputs a bias current which is to be supplied to the base terminals of the transistors 21 and 22 provided in the differential amplifier circuit 13. The bias current which is output from the bias circuit 51 is supplied to the base terminals of the transistors 21 and 22 via the input matching circuit 11. The control circuit 52 individually controls an on state or an off state of the two transistors 31-1 and 31-2 provided in the variable attenuation circuit 14.

A series circuit of a high-frequency signal source SG and a resistor R11 is connected between the input terminals T11 and T12 of the variable gain amplifier 1, and a resistor R12 is connected between the output terminals T21 and T22 of the variable gain amplifier 1. The output terminal T22 is connected to the ground. The resistance value of the resistor R11 is, for example, 100 [Ω], and the resistance value of the resistor R12 is, for example, 50 [Ω].

FIGS. 11A to 11D are diagrams illustrating power gains of the variable gain amplifier according to the first example. Specifically, FIGS. 11A to 11D illustrate power gains at a frequency of 28 [GHz] when the bias current which is output from the bias circuit 51 is set to 22, 31, 42, 54, and 61 [μA] and the input power to the input terminals T11 and T12 is changed.

Figure 11A:
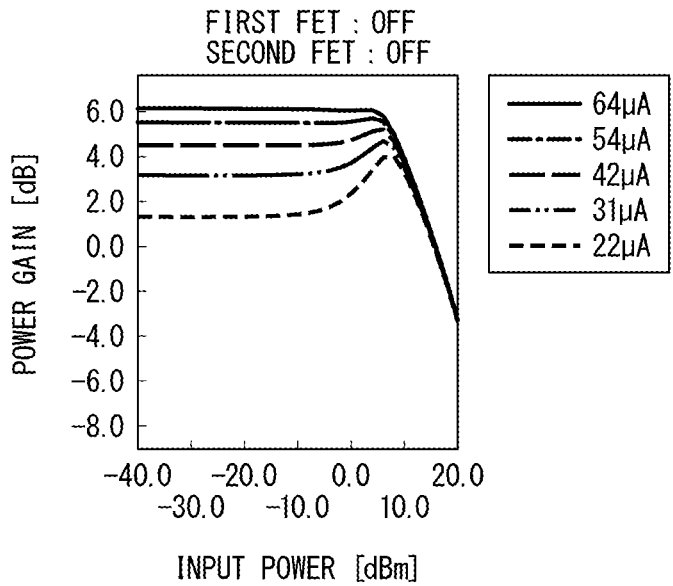
FIGS. 11A to 11D are diagrams illustrating power gains of the variable gain amplifier according to the first example.
Figure 11B:
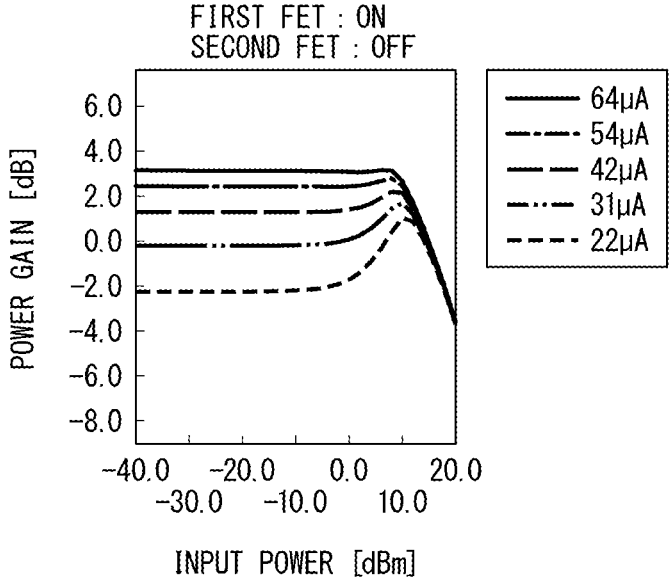
Figure 11C:
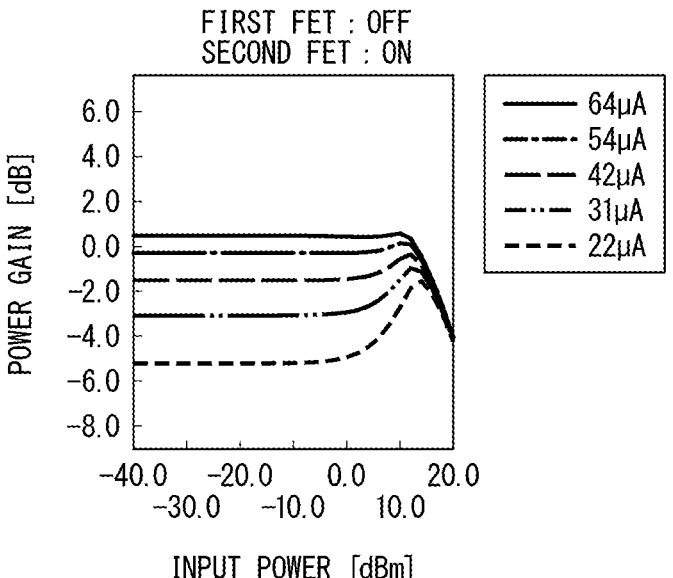
Figure 11D:
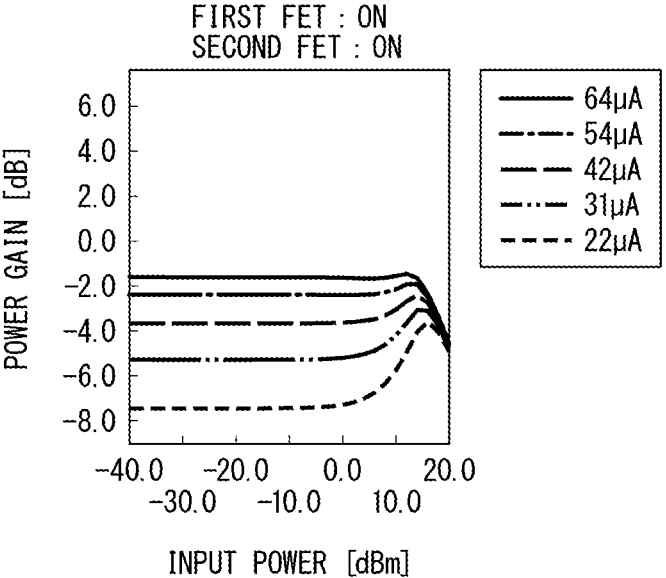

Here, FIG. 11A shows a case where both the transistor 31-2 (first FET) and the transistor 31-1 (second FET) of the variable attenuation circuit 14 are set to be in an off state. FIG. 11B shows a case where the transistor 31-2 (first FET) of the variable attenuation circuit 14 is set to be in an on state and the transistor 31-1 (second FET) thereof is set to be in an off state. FIG. 11C shows a case where the transistor 31-2 (first FET) of the variable attenuation circuit 14 is set to be in an off state and the transistor 31-1 (second FET) thereof is set to be in an on state. FIG. 11D shows a case where both the transistor 31-2 (first FET) and the transistor 31-1 (second FET) of the variable attenuation circuit 14 are set to be in an on state.

Referring to FIG. 11A, it can be understood that, although it is possible to lower the power gain when reducing the bias current, the gain increases and the linearity deteriorates in a case where the input power is high. Referring to FIGS. 11B to 11D, it can be understood that the power gain can be lowered without deteriorating the linearity by setting at least one of the transistor 31-2 (first FET) and the transistor 31-1 (second FET) provided in the variable attenuation circuit 14 to be in an on state (for example, it is clear when comparing the power gain of 3.0 dB (bias current of 31 μA) in the graph shown in FIG. 11A with the power gain of 3.0 dB (bias current of 64 μA) in the graph shown in FIG. 11B). In addition, it can be understood that the power gain can be lowered stepwise by changing a combination of the on state and off state of the transistor 31-2 (first FET) and the transistor 31-1 (second FET).

Second Example

Figure 12:
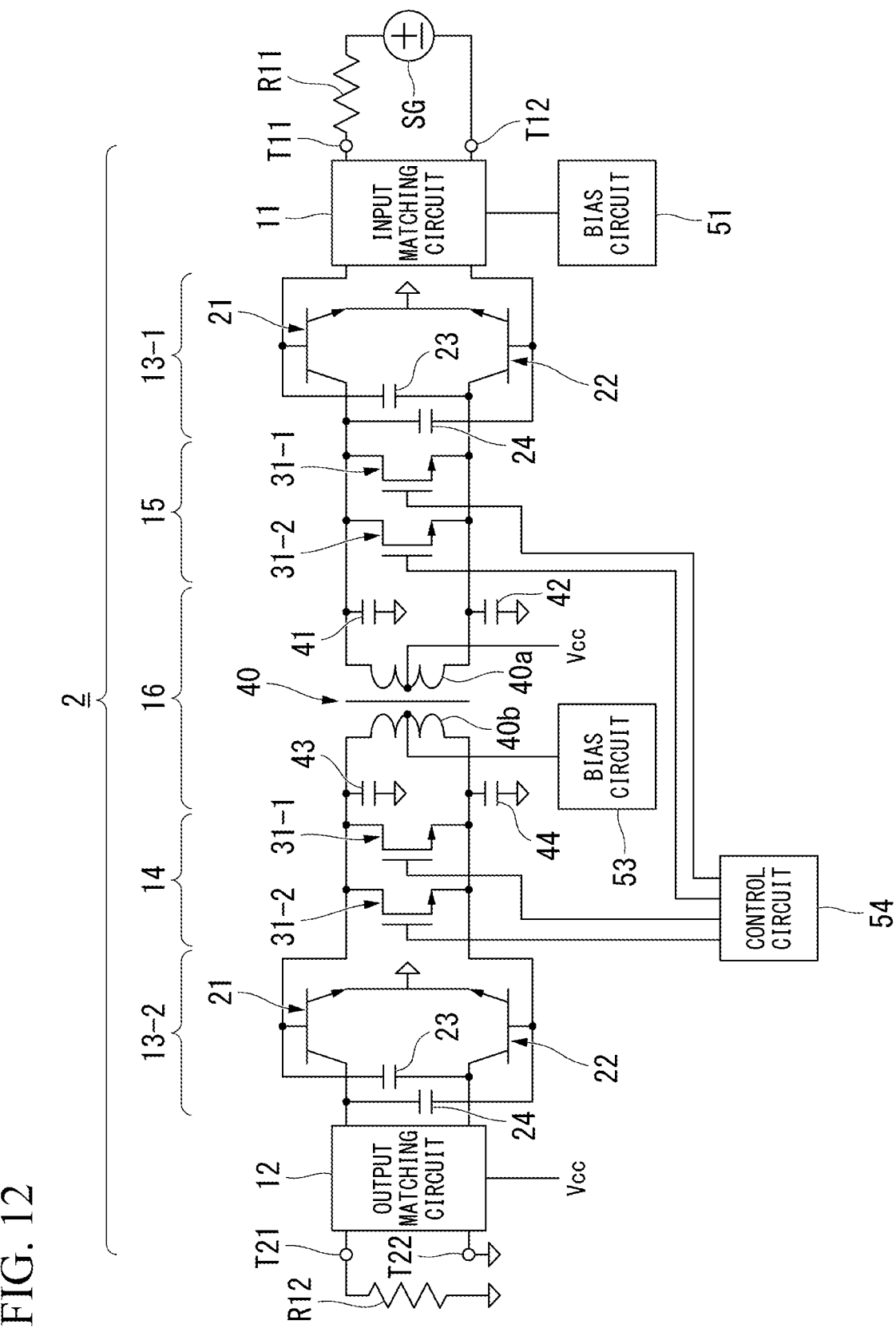
FIG. 12 is a diagram illustrating a variable gain amplifier according to a second example.

FIG. 12 is a diagram illustrating a variable gain amplifier according to a second example. The present example is an example of the variable gain amplifier 2 according to the second embodiment. In FIG. 12, components corresponding to the components shown in FIGS. 2 to 5 are denoted by the same reference numerals and signs. As shown in FIG. 12, the variable gain amplifier 2 includes bias circuits 51 and 53 and a control circuit 54 in addition to the input matching circuit 11, the output matching circuit 12, the differential amplifier circuits 13-1 and 13-2, the variable attenuation circuits 14 and 15, and the inter-stage matching circuit 16.

The differential amplifier circuits 13-1 and 13-2 include the two transistors 21 and 22 and the two neutralization capacitors 23 and 24 similarly to the differential amplifier circuit 13 shown in FIG. 10. The variable attenuation circuits 14 and 15 include the two transistors 31-1 and 31-2 connected in parallel to each other similarly to the variable attenuation circuit 14 shown in FIG. 10. The transistors 31-1 and 31-2 are N-type MOSFETs. Here, the sizes of the transistor 31-1 (second FET) and the transistor 31-2 (first FET) provided in the variable attenuation circuit 15 and the transistor 31-1 (fourth FET) and the transistor 31-2 (third PET) provided in the variable attenuation circuit 14 are as shown in the following Table 2.

TABLE 2

|  | Gate length | Gate width |
|---|---|---|
| First FET | 240 nm | 7.5 μm |
| Second FET | 240 nm | 15 μm |
| Third FET | 240 nm | 45 μm |
| Fourth FET | 240 nm | 90 μm |

As shown in Table 2, the gate widths of the transistors (first and second FETs) of the variable attenuation circuit 15 are different from each other, and the gate width of the transistors (third and fourth FETs) of the variable attenuation circuit 14 are different from each other. In a case where the transistors of the variable attenuation circuit 15 are lined up in ascending order of gate width (7.5 μm, 15 μm) and the transistors of the variable attenuation circuit 14 are lined up in ascending order of gate width (45 μm, 90 μm), the ratios of the gate widths of the transistors in the same place are the same as each other. Specifically, the ratio of the gate width of the third FET to the gate width of the first FET (45/7.5=6) is equal to the ratio of the gate width of the fourth FET to the gate width of the second FET (90/15=6).

A power supply voltage Vcc is supplied to the output matching circuit 12 and the inter-stage matching circuit 16. The power supply voltage Vcc is applied to the collector terminals of the transistors 21 and 22 provided in the differential amplifier circuit 13-2 via the output matching circuit 12. In addition, the power supply voltage Vcc is applied to the collector terminals of the transistors 21 and 22 provided in the differential amplifier circuit 13-1 via the middle point of the primary winding 40a of the transformer 40 provided in the inter-stage matching circuit 16.

The bias circuit 51 is connected to the input matching circuit 11, and the bias circuit 53 is connected to the inter-stage matching circuit 16. The bias circuit 51 outputs a bias current which is to be supplied to the base terminals of the transistors 21 and 22 provided in the differential amplifier circuit 13-1. The bias circuit 53 outputs a bias current which is to be supplied to the base terminals of the transistors 21 and 22 provided in the differential amplifier circuit 13-2.

The bias current which is output from the bias circuit 51 is supplied to the base terminals of the transistors 21 and 22 provided in the differential amplifier circuit 13-1 via the input matching circuit 11. The bias current which is output from the bias circuit 53 is supplied to the base terminals of the transistors 21 and 22 provided in the differential amplifier circuit 13-2 via the middle point of the secondary winding 40*b* of the transformer 40 provided in the inter-stage matching circuit 16. The control circuit 54 individually controls an on state or an off state of the transistors 31-1 and 31-2 provided in the variable attenuation circuits 14 and 15.

The series circuit of the high-frequency signal source SG and the resistor R11 is connected between the input terminals T11 and T12 of the variable gain amplifier 2, and the resistor R12 is connected between the output terminals T21 and T22 of the variable gain amplifier 2. The output terminal T22 is connected to the ground. The resistance value of the resistor R11 is, for example, 100 [Ω], and the resistance value of the resistor R12 is, for example, 50 [Ω]. This is the same as in the first example.

Figure 13A:
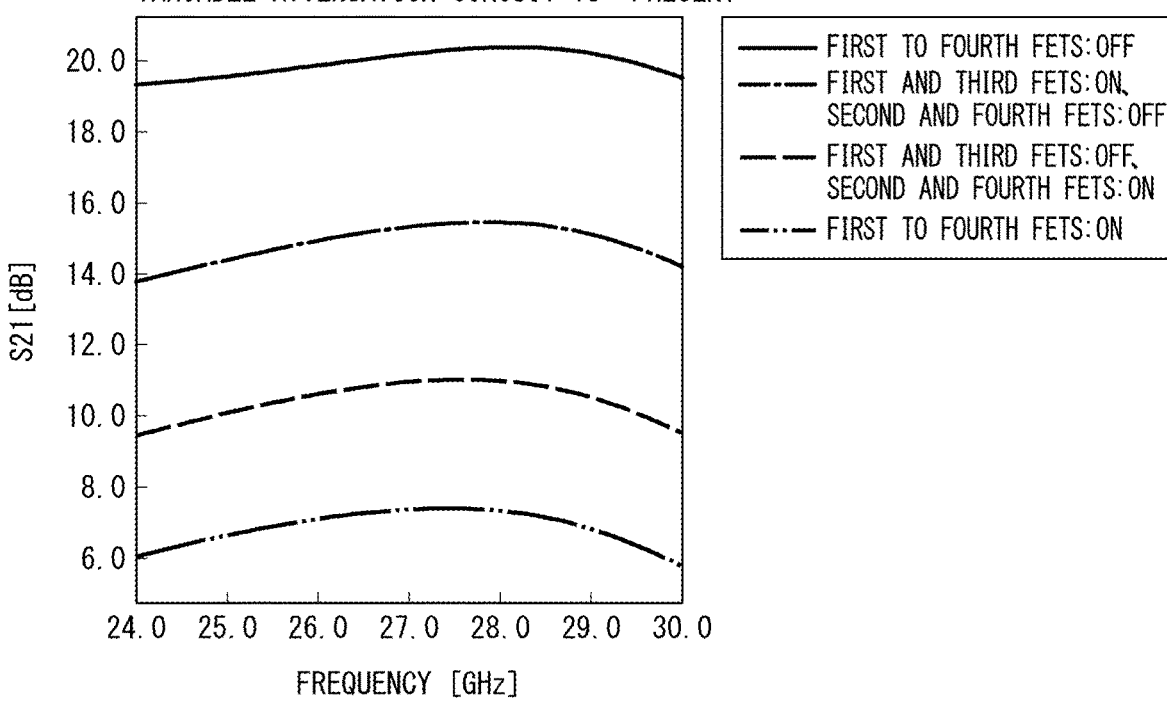
FIGS. 13A and 13B are diagrams illustrating frequency characteristics of pass characteristics of the variable gain amplifier according to the second example.
Figure 13B:
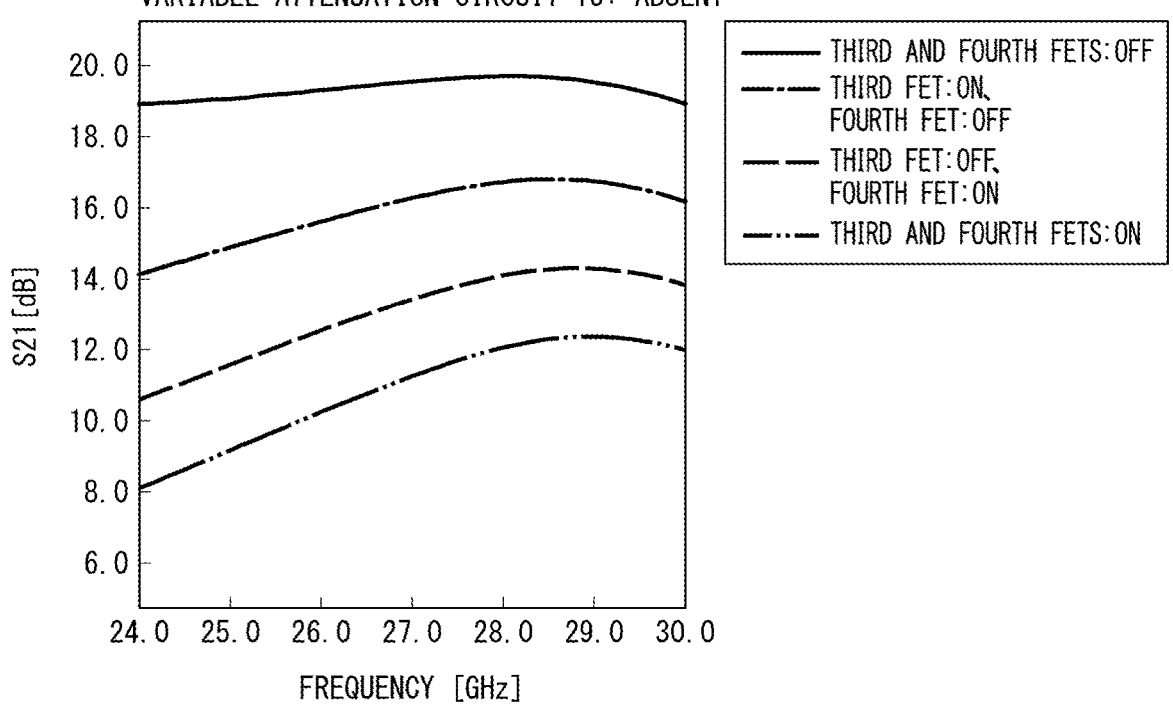

FIGS. 13A and 13B are diagrams illustrating frequency characteristics of pass characteristics of the variable gain amplifier according to the second example. FIG. 13A illustrates frequency characteristics of pass characteristics of the variable gain amplifier 2 in a case where a combination of the on state and off state of the transistors 31-1 and 31-2 provided in the variable attenuation circuits 14 and 15 is changed. FIG. 13B illustrates frequency characteristics of pass characteristics of the variable gain amplifier 2 in a case where a combination of the on state and off state of the transistors 31-1 and 31-2 provided in the variable attenuation circuit 14 is changed with the exception of the variable attenuation circuit 15.

The first FET shown in FIGS. 13A and 13B is the transistor 31-2 provided in the variable attenuation circuit 15, and the second FET is the transistor 31-1 provided in the variable attenuation circuit 15. In addition, the third FET is the transistor 31-2 provided in the variable attenuation circuit 14, and the fourth FET is the transistor 31-1 provided in the variable attenuation circuit 14.

Referring to FIGS. 13A and 13B, it can be understood that the graph shown in FIG. 13A has a larger amount of attenuation and a smaller inclination than the graph shown in FIG. 13B. That is, it can be understood that the frequency characteristics can be improved in a case where the variable attenuation circuit 15 is provided in the variable gain amplifier 2 more than in a case where the variable attenuation circuit 15 is not provided therein.

Third Example

Figure 14:
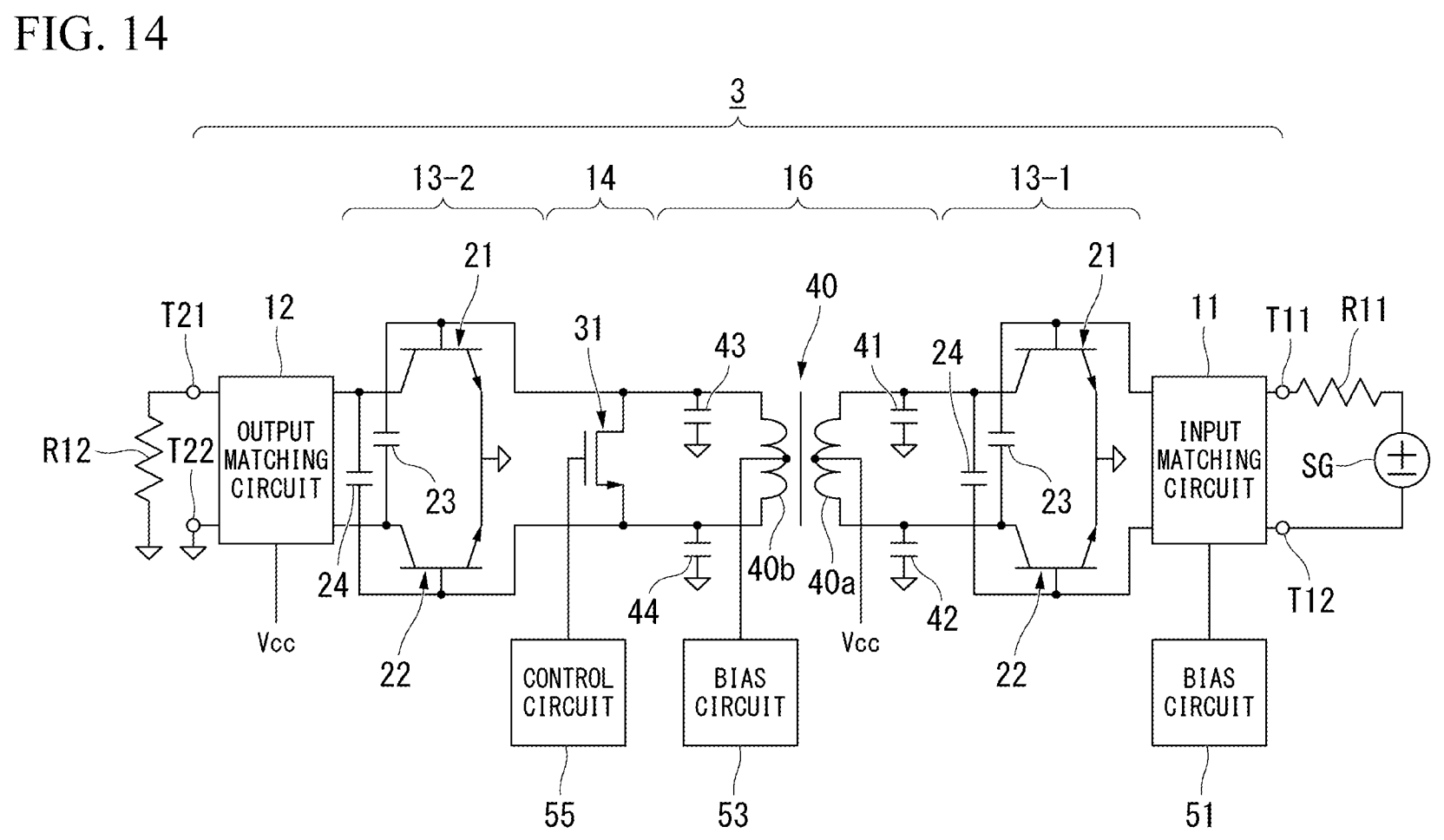

FIG. 14 is a diagram illustrating a variable gain amplifier according to a third example. A variable gain amplifier 3 according to the present example has a configuration in which the configuration of the variable attenuation circuit 14 of the variable gain amplifier 2 shown in FIG. 12 is simplified, the variable attenuation circuit is omitted, and a control circuit 55 is provided instead of the control circuit 54 shown in FIG. 12. In FIG. 14, components corresponding to the components shown in FIGS. 12 and 3A are denoted by the same reference numerals and signs. In addition, the same components as those shown in FIG. 12 will be omitted.

The variable attenuation circuit 14 includes the transistor 31 shown in FIG. 3A. The transistor 31 is an N-type MOSFET. Here, the size of the transistor 31 (FET) and its equivalent resistance are as shown in the following Table 3.

TABLE 3

| | Gate length | Gate width | Equivalent resistance |
|---|---|---|---|
| FET | 240 nm | 150 μm | 7.62Ω |

The control circuit 55 controls an on state or an off state of the transistor 31 provided in the variable attenuation circuit 14. The series circuit of the high-frequency signal source SG and the resistor R11 is connected between the input terminals T11 and T12 of the variable gain amplifier 3, and the resistor R12 is connected between the output terminals T21 and T22 of the variable gain amplifier 3. The output terminal T22 is connected to the ground. The resistance value of the resistor R11 is, for example, 100 [Ω], and the resistance value of the resistor R12 is, for example, 50 [Ω]. This is the same as in the first and second examples.

The following Table 4 indicates power gains of the variable gain amplifier according to the third example. Specifically, Table 4 indicates the power gains at a frequency of 28 [GHz] when the temperature is set to −40, 65, and 125[° C]. Table 4 shows power gains in a case where the transistor 31 (FET) of the variable gain amplifier 3 is set to be in an on state, a case where the transistor 31 (FET) of the variable gain amplifier 3 is replaced with an ideal resistor, and a case where the variable attenuation circuit 14 is removed from the variable gain amplifier 3. The resistance value of the ideal resistor is the resistance value of the equivalent resistance shown in Table 3 (7.62 [Ω]).

TABLE 4

| | Power gain (dB) | | |
|---|---|---|---|
| Temperature | −40° C. | 65° C. | 125° C. |
| Case where FET of variable gain amplifier is turned on | 18.2 | 15.1 | 13.3 |
| Case where FET of variable gain amplifier is replaced with ideal resistor | 20.0 | 15.1 | 12.5 |
| Case where variable attenuation circuit is removed from variable gain amplifier | 26.6 | 21.9 | 19.5 |

Referring to Table 4, a fluctuation in the power gain when the temperature changes from −40[° C.] to 125[° C.] is as follows in each of the cases. The fluctuation is 4.9 [dB] in a case where the transistor 31 (FET) of the variable gain amplifier 3 is set to be in an on state. The fluctuation is 7.5 [dB] in a case where the transistor 31 (FET) of the variable gain amplifier 3 is replaced with the ideal resistance. The fluctuation is 7.1 [dB] in a case where the variable attenuation circuit 14 is removed from the variable gain amplifier 3. Thereby, it can be understood that the temperature characteristics is improved by using the variable attenuation circuit 14 having an FET.

Hereinbefore, although the embodiments and examples of the present invention have been described, the present invention is not limited to the embodiments and examples, and can be freely changed within the scope of the present invention. For example, although the power gain at a frequency of 28 [GHz] has been stated in the above-described examples, the present invention can cope with, for example, high-frequency signals having any frequencies in a microwave band or a millimeter wave band.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A variable gain amplifier comprising:

a differential amplifier circuit having a pair of input terminals and a pair of output terminals, the differential amplifier circuit includes a first differential amplifier circuit and a second differential amplifier circuit;

a first variable attenuation circuit connected between at least one of the pair of input terminals and the pair of output terminals of the first differential amplifier circuit and capable of switching a resistance value on the basis of a control signal which is input from outside;

a second variable attenuation circuit connected between the pair of output terminals of the second differential amplifier circuit at a preceding stage of the first differential amplifier circuit including the pair of input terminals to which the first variable attenuation circuit is connected, and capable of switching a resistance value between the pair of output terminals on the basis of a control signal which is input from the outside; and an inter-stage matching circuit provided between the first variable attenuation circuit and the second variable attenuation circuit; wherein the differential amplifier circuit includes N (N is an integer equal to or greater than 2) differential amplifier circuits cascade-connected to each other in a propagation direction of a high-frequency signal, the first variable attenuation circuit is connected between the pair of input terminals of at least one of the first differential amplifier circuits in second to Nth stages counted from the pair of input terminals of the variable gain amplifier, equivalent resistances of the first variable attenuation circuit and the second variable attenuation circuit have a plurality of levels, and a ratio of the equivalent resistance of second variable attenuation circuit to the equivalent resistance of the first variable attenuation circuit at each of the plurality of levels is equal to a ratio of a primary-side inductance of the inter-stage matching circuit to a secondary-side inductance of the inter-stage matching circuit.

2. The variable gain amplifier according to claim 1, wherein the first variable attenuation circuit includes a transistor connected between the pair of input terminals.

3. The variable gain amplifier according to claim 2, wherein the first variable attenuation circuit includes a resistor connected in series or in parallel to the transistor.

4. The variable gain amplifier according to claim 2, wherein the transistor is controlled to be in an on state or an off state on the basis of the control signal.

5. The variable gain amplifier according to claim 2, wherein:

the first variable attenuation circuit includes a plurality of the transistors; and the plurality of transistors are individually controlled to be in an on state or an off state on the basis of a plurality of the control signals.

6. The variable gain amplifier according to claim 2, wherein the first variable attenuation circuit further includes a bias circuit configured to adjust a resistance value of the transistor by changing a bias voltage applied to the transistor on the basis of a plurality of control signals which are input from the outside.

7. The variable gain amplifier according to claim 1, wherein the second variable attenuation circuit includes a transistor connected between the pair of output terminals.

8. The variable gain amplifier according to claim 7, wherein the second variable attenuation circuit includes a resistor connected in series or in parallel to the transistor.

9. The variable gain amplifier according to claim 7, wherein the transistor is controlled to be in an on state or an off state on the basis of the control signal.

10. The variable gain amplifier according to claim 7, wherein:

the second variable attenuation circuit includes a plurality of the transistors; and the plurality of transistors are individually controlled to be in an on state or an off state on the basis of a plurality of the control signals.

11. The variable gain amplifier according to claim 7, wherein the second variable attenuation circuit further includes a bias circuit configured to adjust a resistance value of the transistor by changing a bias voltage applied to the transistor on the basis of a plurality of control signals which are input from the outside.

12. The variable gain amplifier according to claim 1, wherein:

the first variable attenuation circuit includes a plurality of transistors connected between the pair of input terminals;

the second variable attenuation circuit includes a plurality of transistors connected between the pair of output terminals;

gate widths of the plurality of transistors of the first variable attenuation circuit are different from each other;

gate widths of the plurality of transistors of the second variable attenuation circuit are different from each other; and in a case where the plurality of transistors of the first variable attenuation circuit are lined up in ascending order of gate width and the plurality of transistors of the second variable attenuation circuit are lined up in ascending order of gate width, ratios of gate widths of the transistors in same place are the same as each other.

* * * * *